United States Patent
Kamiya et al.

(10) Patent No.: US 8,617,928 B2
(45) Date of Patent: Dec. 31, 2013

(54) DICING/DIE BONDING FILM

(75) Inventors: Katsuhiko Kamiya, Ibaraki (JP);
Takeshi Matsumura, Ibaraki (JP);
Shuuhei Murata, Ibaraki (JP); Hironao Ootake, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 540 days.

(21) Appl. No.: 12/863,063

(22) PCT Filed: Dec. 16, 2008

(86) PCT No.: PCT/JP2008/072807
§ 371 (c)(1),
(2), (4) Date: Nov. 29, 2010

(87) PCT Pub. No.: WO2009/090817
PCT Pub. Date: Jul. 23, 2009

(65) Prior Publication Data
US 2011/0104873 A1    May 5, 2011

(30) Foreign Application Priority Data
Jan. 18, 2008 (JP) .................. 2008-009489

(51) Int. Cl.
*H01L 21/00* (2006.01)
(52) U.S. Cl.
USPC ............. 438/113; 438/15; 438/33; 438/68; 438/114; 257/723
(58) Field of Classification Search
USPC ......... 438/464, 15, 33, 68, 113, 114; 257/723
See application file for complete search history.

(56) References Cited

U.S. PATENT DOCUMENTS

| | | |
|---|---|---|
| 4,619,867 A | 10/1986 | Charbonneau et al. |
| 4,961,804 A | 10/1990 | Aurichio |

(Continued)

FOREIGN PATENT DOCUMENTS

| | | |
|---|---|---|
| CN | 1497703 | 5/2004 |
| EP | 1262533 A1 | 12/2002 |

(Continued)

OTHER PUBLICATIONS

Aldrich Materials Science, 2012, Thermal Transitions of Homopolymers: Glass Transition and Melting Point, product data sheet, 2 pp.

(Continued)

*Primary Examiner* — Jarrett Stark
*Assistant Examiner* — Nicholas Tobergte
(74) *Attorney, Agent, or Firm* — Knobbe Martens Olson & Bear LLP

(57) ABSTRACT

Provided is a dicing die-bonding film which is excellent in balance between retention of a semiconductor wafer upon dicing and releasability upon picking up. Disclosed is a dicing die-bonding film comprising a dicing film having a pressure-sensitive adhesive layer on a substrate material, and a die-bonding film formed on the pressure-sensitive adhesive layer, wherein the pressure-sensitive adhesive layer contains a polymer including an acrylic acid ester as a main monomer, 10 to 40 mol % of a hydroxyl group-containing monomer based on the acrylic acid ester, and 70 to 90 mol % of an isocyanate compound having a radical reactive carbon-carbon double bond based on the hydroxyl group-containing monomer, and is also cured by irradiation with ultraviolet rays under predetermined conditions after film formation on the substrate material, and wherein the die-bonding film contains an epoxy resin, and is also bonded on the pressure-sensitive adhesive layer after irradiation with ultraviolet rays.

12 Claims, 2 Drawing Sheets

(56) References Cited

U.S. PATENT DOCUMENTS

| | | | | |
|---|---|---|---|---|
| 4,968,559 | A | * 11/1990 | Kuroda et al. | 428/354 |
| 4,997,879 | A | * 3/1991 | Weissgerber et al. | 524/823 |
| 5,814,685 | A | 9/1998 | Satake et al. | |
| 5,902,678 | A | 5/1999 | Konda et al. | |
| 6,010,782 | A | 1/2000 | Uemura et al. | |
| 7,060,339 | B2 | 6/2006 | Matsumura et al. | |
| D549,189 | S | 8/2007 | Misumi et al. | |
| 7,309,925 | B2 | * 12/2007 | Matsumura et al. | 257/797 |
| 7,429,522 | B2 | 9/2008 | Matsumura et al. | |
| 7,449,226 | B2 | 11/2008 | Matsumura et al. | |
| 7,508,081 | B2 | 3/2009 | Matsumura et al. | |
| 7,646,103 | B2 | 1/2010 | Matsumura et al. | |
| 2001/0019766 | A1 | 9/2001 | Masuda et al. | |
| 2002/0091173 | A1 | 7/2002 | Hashimoto et al. | |
| 2003/0008139 | A1 | 1/2003 | Nagamoto et al. | |
| 2004/0230000 | A1 | 11/2004 | Misumi et al. | |
| 2005/0046042 | A1 | 3/2005 | Matsumura et al. | |
| 2005/0139973 | A1 | 6/2005 | Matsumura et al. | |
| 2005/0208736 | A1 | 9/2005 | Matsumura et al. | |
| 2005/0266238 | A1 | 12/2005 | Amano et al. | |
| 2006/0148131 | A1 | 7/2006 | Matsumura et al. | |
| 2006/0204749 | A1 | 9/2006 | Kita et al. | |
| 2007/0026572 | A1 | 2/2007 | Hatakeyama et al. | |
| 2007/0071969 | A1 | 3/2007 | Kontani et al. | |
| 2007/0137782 | A1 | 6/2007 | Matsumura et al. | |
| 2007/0190318 | A1 | 8/2007 | Asai et al. | |
| 2007/0218237 | A1 | 9/2007 | Burmeister et al. | |
| 2008/0011415 | A1 | 1/2008 | Kiuchi et al. | |
| 2008/0118764 | A1 | 5/2008 | Shintani et al. | |
| 2008/0160300 | A1 | 7/2008 | Hwang et al. | |
| 2008/0248296 | A1 | 10/2008 | Shintani et al. | |
| 2009/0149003 | A1 | 6/2009 | Matsumura et al. | |
| 2009/0209089 | A1 | 8/2009 | Murata et al. | |
| 2010/0019365 | A1 | 1/2010 | Matsumura et al. | |
| 2010/0093155 | A1 | 4/2010 | Matsumura et al. | |
| 2010/0233409 | A1 | 9/2010 | Kamiya et al. | |
| 2010/0239866 | A1 | 9/2010 | Matsumura et al. | |
| 2011/0053346 | A1 | 3/2011 | Matsumura et al. | |
| 2011/0104873 | A1 | 5/2011 | Kamiya et al. | |
| 2012/0088333 | A1 | 4/2012 | Matsumura et al. | |

FOREIGN PATENT DOCUMENTS

| | | |
|---|---|---|
| EP | 1 411 547 | 4/2004 |
| EP | 1 464 688 | 10/2004 |
| EP | 1 583 144 | 10/2005 |
| EP | 1591504 A1 | 11/2005 |
| EP | 2 063 460 | 5/2009 |
| JP | 60-057642 | 4/1985 |
| JP | 2-248064 | 10/1993 |
| JP | 2001-226647 | 8/2001 |
| JP | 2001-354930 A | 12/2001 |
| JP | 2002-158276 | 5/2002 |
| JP | 2002-226796 | 8/2002 |
| JP | 2002-226796 A | 8/2002 |
| JP | 2002-343747 A | 11/2002 |
| JP | 2003-013011 | 1/2003 |
| JP | 2003-096412 | 4/2003 |
| JP | 2004-022784 | 1/2004 |
| JP | 2004-134689 | 4/2004 |
| JP | 2005-005355 | 1/2005 |
| JP | 2005-005355 A | 1/2005 |
| JP | 2005-042061 | 2/2005 |
| JP | 2005-116920 | 4/2005 |
| JP | 2005-239884 | 9/2005 |
| JP | 2005-239884 A | 9/2005 |
| JP | 2005-263876 | 9/2005 |
| JP | 2005-298641 | 10/2005 |
| JP | 2005-303275 | 10/2005 |
| JP | 2006-49509 | 2/2006 |
| JP | 2006-165074 | 6/2006 |
| JP | 2006-303472 | 11/2006 |
| JP | 2007-019151 A | 1/2007 |
| JP | 2007-084722 | 4/2007 |
| JP | 2007-238844 | 9/2007 |
| JP | 2007-277282 | 10/2007 |
| JP | 2007-294855 | 11/2007 |
| JP | 2009-135378 | 6/2009 |
| KR | 10-2004-0034479 | 4/2004 |
| KR | 10-2007-0082556 | 8/2007 |
| KR | 10-2009-0043735 | 5/2009 |
| WO | WO 2008/032367 | 3/2008 |

OTHER PUBLICATIONS

Notification of Reasons for Refusal dated Nov. 13, 2012 in Japanese patent application No. 2010-198049.
International Search Report issued on the corresponding PCT Application No. PCT/JP2008/072807, dated Mar. 17, 2009.
Korean Search Report issued by Korean Patent Office issued on the corresponding Korean Patent Application No. 10-2010-7008289, dated Apr. 29, 2010.
File History of the related U.S. Appl. No. 12/372,590, as of Jul. 13, 2010.
File History of the related U.S. Appl. No. 12/741,875, as of Jul. 13, 2010.
File History of the related U.S. Appl. No. 12/741,859, as of Jul. 13, 2010.
Filed History of the related U.S. Appl. No. 12/863,020, as of Jul. 15, 2010.
Japanese Office Action issued on the corresponding Japanese Patent Application No. 2008-9489, dated Sep. 14, 2010.
Japanese Office Action issued on the corresponding Japanese Patent Application No. 2010-093430, dated Sep. 28, 2010.
File History of the related U.S. Appl. No. 12/372,590, for the period of Jul. 14, 2010-Nov. 1, 2010.
File History of the related U.S. Appl. No. 12/741,875, for the period of Jul. 14, 2010-Nov. 1, 2010.
File History of the related U.S. Appl. No. 12/741,859, for the period of Jul. 14, 2010-Nov. 1, 2010.
File History of the related U.S. Appl. No. 12/863,020, for the period of Jul. 16, 2010-Nov. 1, 2010.
Supplemental Search Report issued by the European Patent Office on Jul. 6, 2011 for corresponding European Patent Application No. 08870595.9.
Notification of Reasons for Refusal dated Mar. 12, 2013 in corresponding Japanese patent application No. 2010-198049.
Notification of the First Office Action issued by The State Intellectual Property Office of The People's Republic of China in the corresponding Chinese patent application No. 200880125002.6, Aug. 31, 2011.
Decision of Refusal dated Jul. 17, 2013 in corresponding Japanese patent application No. 2010-198049.
Office Action dated Aug. 16, 2013 in corresponding Taiwanese patent application No. 097149964.

* cited by examiner

US 8,617,928 B2

DICING/DIE BONDING FILM

This application is the U.S. National Phase under 35 U.S.C. §371 of International Application No. PCT/JP2008/072807, filed Dec. 16, 2008, which claims priority to the Japanese Patent Application No. 2008-009489, filed Jan. 18, 2008. The International Application was not published in English under PCT Article 21(2).

TECHNICAL FIELD

The present invention relates to a dicing die-bonding film, that is used in dicing of a workpiece (semiconductor wafer, etc.) under the condition where an adhesive for fixing a chip-shaped workpiece (semiconductor chip, etc.) and an electrode member is pasted on a workpiece before dicing; a method of manufacturing the same; and a method of manufacturing a semiconductor device using the same.

BACKGROUND ART

A semiconductor wafer (workpiece) in which a circuit pattern is formed is diced into semiconductor chips (chip-shaped workpiece) (a dicing step) after the thickness thereof is adjusted as necessary by backside polishing. In the dicing step, the semiconductor wafer is generally washed with an appropriate liquid pressure (normally, about 2 kg/cm$^2$) in order to remove a cutting layer. The semiconductor chip is then fixed onto an adherend such as a lead frame with an adhesive (a mounting step), and then transferred to a bonding step. In the mounting step, the adhesive has been applied onto the lead frame or the semiconductor chip. However, with this method, it is difficult to make the adhesive layer uniform and a special apparatus and a long period of time become necessary in the application of the adhesive. For this reason, a dicing die-bonding film is proposed that adhesively holds the semiconductor wafer in the dicing step and also imparts an adhesive layer for fixing a chip that is necessary in the mounting step (for example, see Patent Document 1: Japanese Patent Application Laid-Open (JP-A) No. 60-57642).

The dicing die-bonding film described in Patent Document 1 is composed of an adhesive layer that is formed on a supporting base material so that it can be peeled. That is, the dicing die-bonding film is made so that after the semiconductor wafer is diced while being held by the adhesive layer, the semiconductor chip is peeled together with the adhesive layer by stretching the supporting base material, the semiconductor chips are individually recovered, and then they are fixed onto an adherend such as a lead frame with the adhesive layer interposed therebetween.

Good holding power toward the semiconductor wafer so that a dicing failure, a dimensional error, etc. do not occur and good peelability in which the semiconductor chip after dicing can be peeled from the supporting base material integrally with the adhesive layer are desired for the adhesive layer of this type of the dicing die-bonding film. However, it has been by no means easy to balance both these characteristics. Particularly, when a large holding power is required for the adhesive layer such as in the method of dicing the semiconductor wafer with a rotary round blade, it has been difficult to obtain a dicing die-bonding film that satisfies the above characteristics.

Therefore, in order to overcome such problems, various improvement methods have been proposed (for example, see Patent Document 2). In Patent Document 2, a method of interposing a pressure sensitive adhesive layer that can be cured by ultraviolet rays between the supporting base material and the adhesive layer, decreasing the adhering force between the pressure sensitive adhesive layer and the adhesive layer by curing this with ultraviolet rays after dicing, and facilitating picking up the semiconductor chip by peeling both layers is proposed.

However, there is the case where a dicing die-bonding film that is excellent in balance between retention upon dicing and releasability after dicing is hardly obtained even by this modified method. For example, when a large semiconductor chip measuring 10 mm×10 mm or more or a very thin semiconductor chip measuring 25 to 75 µm in thickness is to be obtained, it is not easy to pick up the semiconductor chip using a common die bonder.

To solve this problem, Patent Document 3 described below discloses that an attempt is made to improve pickup properties by irradiating the portion corresponding to the semiconductor wafer attaching portion with ultraviolet rays in a pressure-sensitive adhesive layer thereby curing the portion. However, in the dicing die-bonding film described in Patent Document 3, there is the case where adhesive residue of an adhesive constituting a die-bonding film generates in a cut surface after dicing and thus cut surfaces are reattached to each other (blocking), resulting in a problem that it becomes difficult to pick up a semiconductor chip.

Patent Document 1: JP-A 60-57642
Patent Document 2: JP-A 2-248064
Patent Document 3: JP-A 2005-5355

DISCLOSURE OF THE INVENTION

Problems to be Solved by the Invention

The present invention has been made in light of the above problems, and an objective thereof is to provide a dicing die-bonding film including a dicing film having a pressure-sensitive adhesive layer on a substrate material, and a die-bonding film formed on the pressure-sensitive adhesive layer, which even if a semiconductor wafer is thin, is excellent in balance between retention of the semiconductor wafer upon dicing and releasability of its semiconductor chip obtained by dicing together with the die-bonding film; a method of manufacturing the same; and a method of manufacturing a semiconductor device using the same.

Means for Solving the Problems

The present inventors have intensively studied a dicing die-bonding film, a method of manufacturing the same, and a method of manufacturing a semiconductor device using the same so as to achieve the objective described above. As a result, they have found that a dicing die-bonding film obtained by bonding a die-bonding film on a pressure-sensitive adhesive layer before ultraviolet irradiation exhibits high adhesion at the interface between the pressure-sensitive adhesive layer and the die-bonding film and excessively exerts the anchor effect, and thus it occasionally becomes difficult to peel off even if the pressure-sensitive adhesive layer is cured by ultraviolet irradiation and the semiconductor chip is pick up.

A dicing die-bonding film of the present invention comprises a dicing film having a pressure-sensitive adhesive layer on a substrate material, and a die-bonding film formed on the pressure-sensitive adhesive layer, wherein the pressure-sensitive adhesive layer contains a polymer including an acrylic acid ester as a main monomer, 10 to 40 mol % of a hydroxyl group-containing monomer based on the acrylic acid ester, and 70 to 90 mol % of an isocyanate compound having a radical reactive carbon-carbon double bond based on the hydroxyl group-containing monomer, and is also cured by irradiation with ultraviolet rays under predetermined conditions, and wherein the die-bonding film contains an epoxy resin, and is also bonded on the pressure-sensitive adhesive layer after irradiation with ultraviolet rays.

The pressure-sensitive adhesive layer is formed by curing by ultraviolet irradiation in advance before bonding to the die-bonding film. Therefore, the pressure-sensitive adhesive layer surface is hard, thus making it possible to decrease the degree of adhesion with the die-bonding film upon bonding. Whereby, the anchor effect between the pressure-sensitive adhesive layer and the die-bonding film is decreased and, for example, in the case of picking up the semiconductor chip, peeling property between the pressure-sensitive adhesive layer and the die-bonding film becomes satisfactory. As a result, pickup properties can be improved. When the pressure-sensitive adhesive layer is cured by ultraviolet irradiation, the volume of the pressure-sensitive adhesive layer decreases as a result of formation of a crosslinking structure. Therefore, when the pressure-sensitive adhesive layer is cured by irradiating with ultraviolet rays after bonding with the die-bonding film, stress is applied to the die-bonding film. As a result, the entire dicing die-bonding film may warp. However, since the dicing die-bonding film of the present invention is formed by bonding with the die-bonding film after curing by ultraviolet irradiation, it is possible to prevent unnecessary stress from applying on the die-bonding film. As a result, a dicing die-bonding film free from warp can be obtained.

Since the die-bonding film is formed by containing an epoxy resin, for example, even if the film is cut by dicing together with the semiconductor wafer, it is possible to prevent the adhesive residue of the adhesive constituting die-bonding film from generating on the cut surface, thus making it possible to prevent cut surfaces from reattaching to each other (blocking) and to achieve more satisfactory pickup of the semiconductor chip.

Since an acrylic acid ester is used for the pressure-sensitive adhesive layer as a main monomer, the peeling strength can be reduced, thus making it possible to achieve satisfactory pickup properties. Also, poor crosslinking after ultraviolet irradiation is suppressed by adjusting the content of a hydroxyl group-containing monomer to 10 mol % or more. As a result, it is possible to prevent adhesive residue from generating to a dicing ring to be bonded on the pressure-sensitive adhesive layer upon dicing. In contrast, when the content of the hydroxyl group-containing monomer is adjusted to 40 mol % or less, it is possible to prevent deterioration of pickup properties caused because excess crosslinking due to ultraviolet irradiation makes it difficult to perform satisfactory peeling. Productivity can be also prevented from decreasing due to partial gelatinization of the polymer.

In the present invention, since an isocyanate compound having a radical reactive carbon-carbon double bond is employed in place of a polyfunctional monomer, there is no material diffusion of the multi-functional monomer in the die-bonding film. As a result, it is made possible to prevent disappearance of the boundary between the dicing film and the die-bonding film and to achieve more satisfactory pickup properties.

In the above constitution, the acrylic acid ester is preferably $CH_2=CHCOOR$ (in which R is an alkyl group having 6 to 10 carbon atoms). When $CH_2=CHCOOR$ is used as the acrylic acid ester, deterioration of pickup properties caused by excess peeling strength can be prevented by using an acrylic acid ester in which the number of carbon atoms of the alkyl group R in the formula is within a range from 6 to 10.

It is preferred that the irradiation with ultraviolet rays be conducted within a range from 30 to 1,000 $mJ/cm^2$. By adjusting the irradiation with ultraviolet rays to 30 $mJ/cm^2$ or more, the pressure-sensitive adhesive layer is sufficiently cured, thus preventing from excessively adhering to the die-bonding film. As a result, satisfactory pickup properties can be obtained and attachment of the pressure-sensitive adhesive (so-called adhesive residue) on the die-bonding film after picking up can be prevented. In contrast, by adjusting the irradiation with ultraviolet rays to 1,000 $mJ/cm^2$ or less, thermal damage to the substrate material can be reduced. It can be prevented that the expansion property deteriorates due to the tensile modulus becoming too large by the curing of the pressure-sensitive adhesive layer proceeding excessively. The adhesive power is prevented from becoming too low, thus making it possible to prevent the generation of chip fly when a workpiece is diced.

The hydroxyl group-containing monomer is at least any one selected from the group consisting of 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate and (4-hydroxymethylcyclohexyl)methyl(meth)acrylate.

Further, the isocyanate compound having a radical reactive carbon-carbon double bond is at least 2-methacryloyloxyethyl isocyanate or 2-acryloyloxyethyl isocyanate.

By adjusting the weight average molecular weight of the polymer to 350,000 or more, the polymer is prevented from becoming a low-molecular weight polymer, thus making it possible to prevent peeling from a dicing ring stuck on a pressure-sensitive adhesive layer upon dicing. It is also possible to prevent poor crosslinking after ultraviolet irradiation, thus making it possible to prevent the generation of adhesive residue when the dicing ring is peeled off from the pressure-sensitive adhesive layer. In contrast, it is possible to improve workability upon formation of the pressure-sensitive adhesive layer on the substrate material by adjusting the weight average molecular weight to 1,000,000 or less for the following reason. Although the pressure-sensitive adhesive layer is formed by coating a solution of a pressure-sensitive adhesive composition containing the above polymer and drying the solution, when the weight average molecular weight of the polymer is more than 1,000,000, the viscosity of the solution of the pressure-sensitive adhesive composition excessively increases, resulting in deterioration of workability upon the polymerization of the polymer, and coating.

Further, it is preferred that the pressure-sensitive adhesive layer, wherein a tensile modulus at 23° C. after ultraviolet irradiation is within a range from 7 to 170 MPa does not contain acrylic acid. The satisfactory pickup properties can be maintained by adjusting the tensile modulus (23° C.) after ultraviolet irradiation to 7 MPa or more. In contrast, by adjusting the tensile modulus to 170 MPa or less, the generation of chip fly upon dicing can be suppressed.

The pressure-sensitive adhesive layer preferably does not contain acrylic acid. Whereby, the reaction and interaction between the pressure-sensitive adhesive layer and the die-bonding film can be prevented and thus pickup properties can be further improved.

A method of manufacturing a dicing die-bonding film of the present invention comprising a dicing film having a pressure-sensitive adhesive layer on a substrate material, and a die-bonding film formed on the pressure-sensitive adhesive layer is the method comprising the steps of: forming a pressure-sensitive adhesive layer precursor containing a polymer including an acrylic acid ester as a main monomer, 10 to 40 mol % of a hydroxyl group-containing monomer based on the acrylic acid ester, and 70 to 90 mol % of an isocyanate compound having a radical reactive carbon-carbon double bond based on the hydroxyl group-containing monomer, on the substrate material; irradiating the pressure-sensitive adhesive layer precursor with ultraviolet rays under predetermined conditions to form the pressure-sensitive adhesive layer; and bonding the die-bonding film on the pressure-sensitive adhesive layer.

The pressure-sensitive adhesive layer of the dicing film is cured by ultraviolet irradiation in advance before bonding with the die-bonding film. Therefore, a surface of the pressure-sensitive adhesive layer is hard and is in a state where adhesion to unevenness has decreased. According to the present invention, since a dicing die-bonding film is formed by bonding the die-bonding film on the pressure-sensitive adhesive layer, the adhesion between the pressure-sensitive adhesive layer and the die-bonding film is decreased, resulting in a decreased anchor effect. As a result, in the case of picking up the semiconductor chip, a dicing die-bonding film, which is excellent in releasability between the pressure-sensitive adhesive layer and the die-bonding film and exhibits satisfactory pickup properties, is obtained. When the pressure-sensitive adhesive layer is cured by ultraviolet irradiation, the volume of the pressure-sensitive adhesive layer decreases as a result of formation of a crosslinking structure. Therefore, when the pressure-sensitive adhesive layer is cured by irradiating with ultraviolet rays after bonding with the die-bonding film, stress is applied on the die-bonding film, and thus warp may arise in the entire dicing die-bonding film. However, since the dicing die-bonding film of the present invention is formed by bonding with the die-bonding film after being cured by ultraviolet irradiation, it is also possible to prevent application of unnecessary stress on the die-bonding film. As a result, a dicing die-bonding film free from warp can be obtained.

According to the above method, an epoxy resin is used as a constituent material of the die-bonding film. Therefore, even if the semiconductor wafer is cut with the die-bonding film in the case of dicing the semiconductor wafer, a die-bonding film capable of preventing the generation of adhesive residue of the adhesive on the cut surface is formed. As a result, reattachment of cut surfaces to each other (blocking) in the die-bonding film is prevented, thus making it possible to manufacture a dicing die-bonding film having excellent pickup properties.

Since an acrylic acid ester is used as a constituent material of the pressure-sensitive adhesive layer, the adhesive power can be decreased, thus making it possible to achieve satisfactory pickup properties. Furthermore, poor crosslinking after ultraviolet irradiation is suppressed by adjusting the content of a hydroxyl group-containing monomer to 10 mol % or more. As a result, it is also possible to prevent the generation of adhesive residue on a dicing ring to be bonded on the pressure-sensitive adhesive layer upon dicing. In contrast, by adjusting the content to 40 mol % or less, it is possible to prevent deterioration of pickup properties caused because excess crosslinking due to ultraviolet irradiation makes it difficult to perform satisfactory peeling. Productivity can be also prevented from decreasing due to partial gelatinization of the polymer.

Since an isocyanate compound having a radical reactive carbon-carbon double bond is used in place of a multi-functional monomer in the present invention, there is no material diffusion of the multi-functional monomer in the die-bonding film. As a result, the boundary between the dicing film and the die-bonding film is prevented from disappearing, thus making it possible to achieve more satisfactory pickup properties.

It is preferred that the irradiation with ultraviolet rays be conducted within a range from 30 to 1,000 mJ/cm$^2$. By adjusting the irradiation with ultraviolet rays to 30 mJ/cm$^2$ or more, the pressure-sensitive adhesive layer is sufficiently cured, thus preventing from excessively adhering to the die-bonding film. As a result, satisfactory pickup properties can be obtained and attachment of the pressure-sensitive adhesive (so-called adhesive residue) on the die-bonding film after picking up can be prevented. In contrast, by adjusting the irradiation with ultraviolet rays to 1,000 mJ/cm$^2$ or less, thermal damage to the substrate material can be reduced. It can be prevented that the expansion property deteriorates due to the tensile modulus becoming too large by the curing of the pressure-sensitive adhesive layer proceeding excessively. Furthermore, the adhesive power is prevented from becoming too low, thus making it possible to prevent the generation of chip fly when a workpiece is diced.

To solve the above-mentioned problems, a method of manufacturing a semiconductor device of the present invention using a dicing die bonding film having a dicing film with a pressure-sensitive adhesive layer on a substrate material, and a die-bonding film formed on the pressure-sensitive adhesive layer comprises the steps of preparing the dicing die-bonding film in which the pressure-sensitive adhesive layer contains a polymer including an acrylic acid ester as a main monomer, 10 to 40 mol % of a hydroxyl group-containing monomer based on the acrylic acid ester, and 70 to 90 mol % of an isocyanate compound having a radical reactive carbon-carbon double bond based on the hydroxyl group-containing monomer, and is also cured by irradiation with ultraviolet rays under predetermined conditions, and wherein the die-bonding film contains an epoxy resin, and is also bonded on the pressure-sensitive adhesive layer after irradiation with ultraviolet rays; pressure-bonding a semiconductor wafer on the die-bonding film; dicing the semiconductor wafer together with the die-bonding film to form a semiconductor chip; and peeling the semiconductor chip from the pressure-sensitive adhesive layer together with the die-bonding film; wherein the step of pressure-bonding of the semiconductor wafer to the step of peeling the semiconductor chip are conducted without irradiating the pressure-sensitive adhesive layer with ultraviolet rays.

In the above method, a dicing die-bonding film, which prevents the generation of chip fly of a semiconductor chip and is also excellent in pickup properties, is used in the case of dicing a semiconductor wafer. Therefore, the chip can be easily peeled off from the dicing film, together with the die-bonding film in the case of a large semiconductor chip measuring 10 mm×10 mm or more or an extremely thin semiconductor chip measuring 25 to 75 μm. According to the above method, a semiconductor device can be manufactured by decreasing the yield ratio.

Also, it is not necessary to irradiate the pressure-sensitive adhesive layer with ultraviolet rays before picking up. As a result, the number of steps can be decreased as compared with a conventional method of manufacturing a semiconductor device. Furthermore, the generation of defects of a circuit pattern caused by irradiation with ultraviolet rays can be prevented even if a semiconductor wafer has a predetermined circuit pattern. As a result, it becomes possible to manufacture a semiconductor device with high reliability.

According to the above method, since a dicing die-bonding film with a die-bonding film using an epoxy resin as a constituent material is used, it is possible to prevent cut surfaces from reattaching to each other (blocking) due to adhesive residue of an adhesive on the cut surface of a die-bonding film even in the case of dicing a semiconductor wafer. As a result, it becomes easy to peel a semiconductor chip and thus the yield ratio can be decreased.

DESCRIPTION OF REFERENCE NUMERALS

Figure 1:
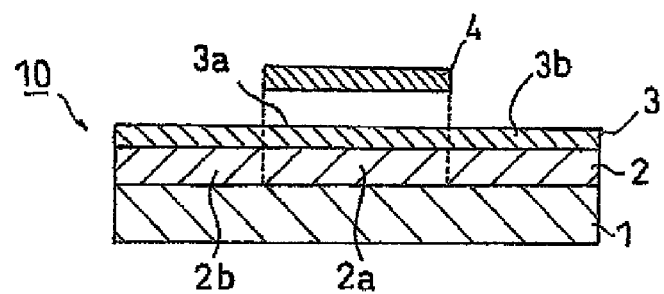
FIG. 1 is a schematic sectional view showing a dicing die-bonding film according to one aspect of the present invention.

1: Substrate material
2: Pressure-sensitive adhesive layer
3: Die-bonding film
4: Semiconductor wafer
5: Semiconductor chip
6: Adherend
7: Bonding wire
8: Sealing resin
9: Spacer
10, 11: Dicing die-bonding film

Figure 2:
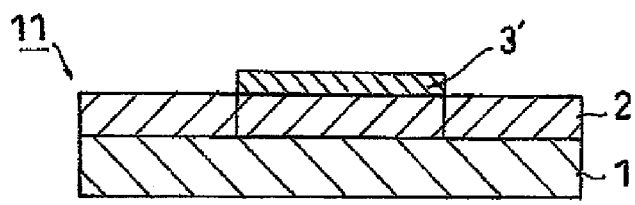
FIG. 2 is a schematic sectional view showing a dicing die-bonding film according to another aspect of the present invention.

BEST MODE FOR CARRYING OUT THE INVENTION (Dicing Die-Bonding Film)
The embodiment of the present invention is described referring to FIGS. 1 and 2. FIG. 1 is a cross-sectional schematic drawing showing a dicing die-bonding film according to the present embodiment. FIG. 2 is a cross-sectional schematic drawing showing another dicing die-bonding film according to the present embodiment. However, parts that are unnecessary for the description are not given, and there are parts shown by magnifying, minifying, etc. in order to make the description easy.

As shown in FIG. 1, a dicing die-bonding film 10 has a configuration having a dicing film in which a pressure sensitive adhesive layer 2 is provided on a base material 1 and a die-bonding film 3 is provided on the pressure sensitive adhesive layer 2. Further, the present invention may have a configuration in which a die-bonding film 3' is formed only in a semiconductor wafer pasting part 2a as shown in FIG. 2.

The base material 1 has ultraviolet ray transmission and is a strength matrix of the dicing die-bonding films 10, 11. Examples thereof include polyolefin such as low-density polyethylene, straight chain polyethylene, intermediate-density polyethylene, high-density polyethylene, very low-density polyethylene, random copolymer polypropylene, block copolymer polypropylene, homopolypropylene, polybutene, and polymethylpentene; an ethylene-vinylacetate copolymer; an ionomer resin; an ethylene(meth)acrylic acid copolymer; an ethylene(meth)acrylic acid ester (random or alternating) copolymer; an ethylene-butene copolymer; an ethylene-hexene copolymer; polyurethane; polyester such as polyethyleneterephthalate and polyethylenenaphthalate; polycarbonate; polyetheretherketone; polyimide; polyetherimide; polyamide; whole aromatic polyamides; polyphenylsulfide; aramid (paper); glass; glass cloth; a fluorine resin; polyvinyl chloride; polyvinylidene chloride; a cellulose resin; a silicone resin; metal (foil); and paper.

Further, the material of the base material 1 includes a polymer such as a cross-linked body of the above resins. The above plastic film may be also used unstretched, or may be also used on which a monoaxial or a biaxial stretching treatment is performed depending on necessity. According to resin sheets in which heat shrinkable properties are given by the stretching treatment, etc., the adhesive area of the pressure sensitive adhesive layer 2 and the die-bonding films 3, 3' is reduced by thermally shrinking the base material 1 after dicing, and the recovery of the semiconductor chips can be facilitated.

A known surface treatment such as a chemical or physical treatment such as a chromic acid treatment, ozone exposure, flame exposure, high voltage electric exposure, and an ionized radiation treatment, and a coating treatment by an undercoating agent (for example, a tacky substance described later) can be performed on the surface of the base material 1 in order to improve adhesiveness, holding properties, etc. with the adjacent layer.

The same type or different type of base material can be appropriately selected and used as the base material 1, and a base material in which a plurality of types are blended can be used depending on necessity. Further, a vapor-deposited layer of a conductive substance composed of a metal, an alloy, an oxide thereof, etc. and having a thickness of about 30 to 500 angstrom can be provided on the base material 1 in order to give an antistatic function to the base material 1. The base material 1 may be a single layer or a multi layer of two or more types.

The thickness of the base material 1 can be appropriately decided without limitation particularly. However, it is generally about 5 to 200 μm.

The pressure-sensitive adhesive layer 2 is formed from an ultraviolet-ray curing-type pressure-sensitive adhesive, and it is cured by the ultraviolet irradiation in advance. The cured portion is not necessarily the entire region of the pressure-sensitive adhesive layer 2, and at least a portion 2a corresponding to a semiconductor wafer attaching portion 3a of the pressure-sensitive adhesive layer 2 may be cured (see FIG. 1). Since the pressure-sensitive adhesive layer 2 is cured by the ultraviolet irradiation before bonding with a die-bonding film 3, the surface thereof is hard, and the excessively high adhesion is suppressed at the interface between the pressure-sensitive adhesive layer 2 and the die-bonding film 3. Thus, the anchor effect between the pressure-sensitive adhesive layer 2 and the die-bonding film 3 is decreased, and the peeling property can be improved.

By curing the ultraviolet-ray curing-type pressure-sensitive adhesive layer 2 matching in the shape of a die-bonding film 3' shown in FIG. 2 in advance, excessively high adhesion is suppressed at the interface between the pressure-sensitive adhesive layer 2 and the die-bonding film 3. Thus, the die-bonding film 3' has a characteristic of peeling easily off the pressure-sensitive adhesive layer 2 upon picking up. On the other hand, the other portion 2b of the pressure-sensitive adhesive layer 2 is not cured because it has not irradiated with ultraviolet rays, and the adhesive power thereof is higher than that of the portion 2a. Thus, when bonding a dicing ring 12 to the other portion 2b, the dicing ring 12 can be certainly adhered and fixed.

As described above, in the pressure sensitive adhesive layer 2 of the dicing die-bonding film 10 shown in FIG. 1, the part 2b formed by a non-cured ultraviolet ray curable pressure sensitive adhesive sticks to the die-bonding film 3, and the holding force when dicing can be secured. In such a way, the ultraviolet ray curable pressure sensitive adhesive can support the die-bonding film 3 for fixing the semiconductor chip onto an adherend such as a substrate with good balance of adhesion and peeling. In the pressure sensitive adhesive layer 2 of the dicing die-bonding film 11 shown in FIG. 2, a dicing ring is fixed to the part 2b. The dicing ring made of a metal such as stainless steel or a resin can be used for example.

In the dicing die-bonding film 10, the adhesive power of the portion 2a in the pressure-sensitive adhesive layer 2 to the semiconductor wafer attaching portion 3a is preferably designed to be smaller than the adhesive power of the other portion 2b to a portion 3b that differs from the semiconductor wafer attaching portion 3a. The adhesive power of the portion 2a under the condition of a normal temperature of 23° C., a peeling angle of 15 degrees, and a peeling rate of 300 mm/min is preferably 0.5 to 1.5 N/10 mm from the viewpoints of fixing and holding strength of the wafer, recovering property of a chip that is formed. When the adhesive power is less than 0.5 N/10 mm, the adhesion and fixing of a semiconductor chip becomes insufficient, and therefore chip fly may be generated upon dicing. When the adhesive power exceeds 1.5 N/10 mm, the pressure-sensitive adhesive layer 2 excessively adheres to the die-bonding film 3, and therefore the picking up of the semiconductor chip may become difficult. On the other hand, the adhesive power of the other portion 2b is preferably from 0.5 to 10 N/10 mm, and more preferably from 1 to 5 N/10 mm. Even when the portion 2a has low adhesive power, the generation of chip fly can be suppressed by the adhesive power of the other portion 2b, and the holding strength that is necessary for a wafer process can be exhibited.

In the dicing die-bonding film 11, the adhesive power of the portion 2a in the pressure-sensitive adhesive layer 2 to the semiconductor wafer attaching portion 3a is preferably designed to be smaller than the adhesive power of the other portion 2b to a dicing ring 12. The adhesive power of the portion 2a to the semiconductor wafer attaching portion 3a (under the same conditions as described above) is preferably 0.5 to 1.5 N/10 mm as the same as described above. On the other hand, the adhesive power of the other portion 2b to the dicing ring 12 is preferably from 0.05 to 10 N/10 mm, and more preferably from 0.1 to 5 N/10 mm. Even when the portion 2a has low peeling adhesive power, the generation of chip fly can be suppressed by the adhesive power of the other portion 2b, and the holding strength that is sufficient for a wafer process can be exhibited. These adhesive powers are based on a measured value at a normal temperature of 23° C., a peeling angle of 180 degrees, and a tensile speed of 300 mm/min.

In the dicing die-bonding films 10, 11, the adhesive power of the wafer attaching portion 3a to the semiconductor wafer is preferably designed to be larger than the adhesive power of the wafer attaching portion 3a to the portion 2a. The adhesive power to the semiconductor wafer is appropriately adjusted depending on its type. The adhesive power of the semiconductor wafer attaching portion 3a to the portion 2a (under the same conditions as described above) is preferably from 0.05 to 10 N/10 mm, and more preferably from 1 to 5 N/10 mm. On the other hand, the adhesive power of the semiconductor wafer attaching portion 3a to the semiconductor wafer (under the same conditions as described above) is preferably from 0.5 to 15 N/10 mm, and more preferably from 1 to 15 N/10 mm from the viewpoints of reliability upon dicing, picking up and die bonding as well as the pickup properties.

It is preferred to satisfy a relationship of $r_1 < r_2 < r_3$, where $r_1$ is the diameter of a semiconductor wafer 4, $r_2$ is the diameter of the portion 2a in the pressure-sensitive adhesive layer 2, and $r_3$ is the diameter of the semiconductor wafer attaching portion 3a in the die-bonding film 3 (or the die-bonding film 3'). Thus, the entire face of the semiconductor wafer 4 can be adhered and fixed onto the die-bonding films 3, 3', and the peripheral part of the semiconductor wafer attaching portion 3a (or the die-bonding film 3') can be adhered and fixed to the other portion 2b. Since the adhesive power of other portion 2b is higher than that of the portion 2a, the semiconductor wafer attaching portion 3a (or the die-bonding film 3') can be adhered and fixed at the peripheral part. As a result, the generation of chip fly can be further prevented upon dicing.

The ultraviolet ray curable pressure sensitive adhesive that is used has a ultraviolet ray curable functional group of a radical reactive carbon-carbon double bond, etc., and adherability. Examples of the ultraviolet ray curable pressure sensitive adhesive are an added type ultraviolet ray curable pressure sensitive adhesive in which a ultraviolet ray curable monomer component or an oligomer component is compounded into an acryl pressure sensitive adhesive. The acryl pressure sensitive adhesive is a pressure sensitive adhesive having an acryl polymer as a base polymer, and it is preferable in the respect of purifying and cleaning properties, etc. of electric parts that have to be kept away from contamination such as a semiconductor wafer and a glass with ultra pure water and an organic solvent such as alcohol.

Specific examples of the acryl polymers include an acryl polymer in which acrylate is used as a main monomer component. Examples of the acrylate include alkyl acrylate (for example, a straight chain or branched chain alkyl ester having 1 to 30 carbon atoms, and particularly 4 to 18 carbon atoms in the alkyl group such as methylester, ethylester, propylester, isopropylester, butylester, isobutylester, sec-butylester, t-butylester, pentylester, isopentylester, hexylester, heptylester, octylester, 2-ethylhexylester, isooctylester, nonylester, decylester, isodecylester, undecylester, dodecylester, tridecylester, tetradecylester, hexadecylester, octadecylester, and eicosylester) and cycloalkyl acrylate (for example, cyclopentylester, cyclohexylester, etc.). These monomers may be used alone or two or more types may be used in combination.

Among the acrylates exemplified above, a monomer exemplified by a chemical formula $CH_2=CHCOOR$ (in the formula, R is an alkyl group having 6 to 10 carbon atoms, and more preferably having 8 to 9 carbon atoms) is preferably used in the present invention. When the number of carbon atoms is less than 6, the adhesive strength becomes too large and there is a case where the pickup properties decrease. On the other hand, when the number of carbon atoms exceeds 10, the adhesiveness with the die-bonding film decreases, and as a result, there is a case where chip fly is generated when dicing. Further, when acrylate is expressed by a chemical formula $CH_2=CHCOOR$, its content is preferably 50 to 91 mol % and more preferably 80 to 87 mol %, based on the entire monomer component. When the content is less than 50 mol %, the adhesive strength becomes too large, and there is a case where the pickup properties decreases. On the other hand, when it exceeds 91 mol %, the adherability decreases, and there is a case where the chip fly is generated when dicing. Furthermore, among monomers expressed by the above chemical formula, 2-ethylhexylacrylate and isooctylacrylate are particularly preferable.

The acryl polymer contains a hydroxyl group-containing monomer copolymerizable with the acrylate as an essential component. Examples of the hydroxyl group-containing monomer include 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)methyl(meth)acrylate.

The content of the hydroxyl group-containing monomer is preferably within a range from 10 to 40 mol %, and more preferably from 15 to 30 mol % based on the acrylic acid ester. When the content is less than 10 mol %, crosslinking after ultraviolet irradiation becomes insufficient and pickup properties may deteriorate. In contrast, when the content exceeds 40 mol %, peeling becomes difficult because the polarity of the pressure-sensitive adhesive becomes high and the interaction with the die-bonding film becomes intense.

The acryl polymer may contain a unit corresponding to other monomer components copolymerizable with the alkyl acrylate or cycloalkylester depending on necessity for the purpose of modification of cohesion force, heat resistance, etc. Examples of such monomer components include a carboxyl group-containing monomer such as acrylic acid, methacrylic acid, carboxyethyl(meth)acrylate, carboxypentyl(meth)acrylate, itaconic acid, maleic acid, fumaric acid, and crotonic acid; an acid anhydride monomer such as maleic anhydride and itaconic anhydride; a sulfonic acid group-containing monomer such as styrenesulfonic acid, allylsulfonic acid, 2-(meth)acrylamide-2-methylpropanesulfonic acid, (meth)acrylicamidepropanesulfonic acid, sulfopropyl (meth)acrylate, and (meth)acryloyloxynaphthalenesulfonic acid; a phosphoric acid containing monomer such as 2-hydroxyethylacryloylphosphate; acrylamide; and acrylonitrile. One type or two types or more of these copolymerizable monomer components can be used. The use amount of these copolymerizable monomers is preferably 40% by weight or less of the entire monomer components. However, in the case of the carboxyl group-containing monomer, an interface between the pressure sensitive adhesive layer 2 and the die-bonding film 3 disappears when the carboxyl group reacts with an epoxy group in an epoxy resin in the die-bonding film 3, and the peelability of both may decrease. Therefore, the use amount of the carboxyl group-containing monomer is preferably 0 to 3% by weight of the entire monomer component. Additionally, because the hydroxyl group-containing monomer and a glycidyl group-containing monomer can also react with the epoxy group in the epoxy resin, the use amounts of these are preferably made to be the same as the case of the carboxyl group-containing monomer. Further, among these monomer components, the pressure sensitive adhesive layer 2 of the present invention does not preferably contain acrylic acid. Because, there is a case that the peeling property deteriorates by disappearance of the interface between the pressure-sensitive adhesive layer 2 and the die-bonding film 3 by material diffusion of acrylic acid into the die-bonding film 3.

Here, the acryl polymer does not contain a polyfunctional monomer as the monomer component for copolymerization. Accordingly, the polyfunctional monomer does not undergo mass diffusion to the die-bonding film, and the decrease in the pickup properties is prevented, caused by disappearing the interface between the pressure sensitive adhesive layer 2 and the die-bonding film 3.

Further, the acryl polymer may contain an isocyanate compound having a radical reactive carbon-carbon double bond. Examples of the isocyanate compound include methacryloylisocyanate, 2-methacryloyloxyethylisocyanate, 2-acryloyloxyethylisocyanate, and m-isopropenyl-α,α-dimethylbenzylisocyanate.

The content of the isocyanate compound is preferably in a range of 70 to 90 mol %, and more preferably in a range of 75 to 85 mol % based on the hydroxyl group-containing monomer. When the content is less than 70 mol %, the crosslinking after ultraviolet ray irradiation becomes insufficient, and an pickup properties decrease. On the other hand, when the content exceeds 90 mol %, polarity of the pressure sensitive adhesive becomes high, interaction with the die-bonding film becomes high, and therefore the peeling becomes difficult and the pickup properties decrease.

The acrylic polymer can be obtained by polymerizing a monomer alone or a mixture of two or more kinds of monomers. The polymerization can be conducted by any of methods such as solution polymerization, emulsion polymerization, bulk polymerization and suspension polymerization. The content of a low-molecular weight material is preferably small from the viewpoint of preventing contamination of a clean adherend. In this respect, the weight average molecular weight of the acrylic polymer is preferably from 350,000 to 1,000,000, and more preferably from about 450,000 to 800,000.

Further, an external crosslinking agent can be appropriately adopted in the pressure-sensitive adhesive so as to adjust the adhesive power before and after the ultraviolet irradiation. A specific method of external crosslinking is a method of adding and reacting a so-called crosslinking agent such as a polyisocyanate compound, an epoxy compound, an aziridine compound or a melamine-based crosslinking agent. In the case of using the external crosslinking agent, the amount of the external crosslinking agent to be used is appropriately determined by balance with a base polymer to be crosslinked and also the usage as a pressure-sensitive adhesive. In general, the amount is about 20 parts by weight or less, and preferably from 0.1 to 10 parts by weight, based on 100 parts by weight of the base polymer. Furthermore, various conventionally known additives such as a tackifier and an anti-aging agent other than the above-described components may be used in the pressure-sensitive adhesive as necessary.

Examples of the ultraviolet curable monomer component to be compounded include such as an urethane oligomer, urethane(meth)acrylate, trimethylolpropane tri(meth)acrylate, tetramethylolmethane tetra(meth)acrylate, pentaerythritol tri(meth)acrylate, pentaerythritol tetra(meth)acrylate, dipentaerythritol monohydroxypenta(meth)acrylate, dipentaerythritol hexa(meth)acrylate, and 1,4-butane dioldi(meth)acrylate. Further, the ultraviolet curable oligomer component includes various types of oligomers such as an urethane based, a polyether based, a polyester based, a polycarbonate based, and a polybutadiene based oligomer, and its molecular weight is appropriately in a range of about 100 to 30,000. The compounding amount of the ultraviolet ray curable monomer component and the oligomer component can be appropriately determined to an amount in which the adhesive strength of the pressure sensitive adhesive layer can be decreased depending on the type of the pressure sensitive adhesive layer. Generally, it is for example 5 to 500 parts by weight, and preferably about 40 to 150 parts by weight based on 100 parts by weight of the base polymer such as an acryl polymer constituting the pressure sensitive adhesive.

Further, besides the added type ultraviolet ray curable pressure sensitive adhesive described above, the ultraviolet ray curable pressure sensitive adhesive includes an internal ultraviolet ray curable pressure sensitive adhesive using a polymer having a radical reactive carbon-carbon double bond in the polymer side chain, in the main chain, or at the end of the main chain as the base polymer. The internal ultraviolet curable pressure sensitive adhesives of an internally provided type are preferable because they do not have to contain the oligomer component, etc. that is a low molecular weight component, or most of them do not contain, they can form a pressure sensitive adhesive layer having a stable layer structure without migrating the oligomer component, etc. in the pressure sensitive adhesive over time.

As the base polymer having a radical reactive carbon-carbon double bond, for example, those having a radical reactive carbon-carbon double bond and having adhesion can be used without any limitation. The base polymer preferably has an acrylic polymer as a basic skeleton. As the basic skeleton of the acrylic polymer, the acrylic polymers listed above are exemplified.

The method of introducing the radical reactive carbon-carbon double bond into the acryl polymer is not particularly limited, and various methods can be adopted. However, it is easy to introduce the radical reactive carbon-carbon double bond into the polymer side chain from the viewpoint of a molecular design. For example, a method of copolymerizing a monomer having a hydroxyl group with the acryl polymer in advance and then performing a condensation or an addition reaction on an isocyanate compound having an isocyanate group that can react with this hydroxyl group and a radical reactive carbon-carbon double bond while keeping ultraviolet ray curability of the radical reactive carbon-carbon double bond. Examples of the isocyanate compound having an isocyanate group and a radical reactive carbon-carbon double bond include those exemplified above. Further, those in which the exemplified hydroxyl group-containing monomer and an ether based compound such as 2-hydroxyethylvinylether, 4-hydroxybutylvinylether, and diethylene glycol monovinylether, etc. are copolymerized can be used as the acryl polymer.

In the internal type ultraviolet-ray curing-type pressure-sensitive adhesive, the base polymer (especially an acrylic polymer) having a radical reactive carbon-carbon double bond can be used alone. However, an ultraviolet-ray curable monomer component and an oligomer component may also be mixed as long as characteristics do not deteriorate. The amount of the ultraviolet-ray curable oligomer component is usually from 5 to 500 parts by weight, and preferably from 40 to 150 parts by weight, based on 100 parts by weight of the base polymer.

A photopolymerization initiator is contained in the internal ultraviolet ray curable pressure sensitive adhesive in the case of curing with radiation such as ultraviolet rays. Examples of the photopolymerization initiator include an α-ketol based compound such as 4-(2-hydroxyethoxy)phenyl(2-hydroxy-2-propyl)ketone, α-hydroxy-α,α'-dimethylacetophenone, 2-methyl-2-hydroxypropyophenone, and 1-hydroxycyclohexylphenylketone; an acetophenone based compound such as methoxyacetophenone, 2,2-dimethoxy-2-phenylacetophenone, 2,2-diethoxyacetophenone, and 2-methyl-1-[4-(methylthio)-phenyl]-2-morpholinopropane-1; a benzoinether based compound such as benzoinethylether, benzoinisopropylether, and anisoinmethylether; a ketal based compound such as benzyldimethylketal; an aromatic sulfonylchloride based compound such as 2-naphthalenesulfonylchloride; a photoactive oxime based compound such as 1-phenone-1,1-propanedion-2-(o-ethoxycarbonyl)oxime; a benzophenone based compound such as benzophenone, benzoylbenzoic acid and 3,3'-dimethyl-4-methoxybenzophenone; a thioxanthone based compound such as thioxanthone, 2-chlorothioxanthone, 2-methylthioxanthone, 2,4-dimethylthioxanthone, isopropylthioxanthone, 2,4-dichlorothioxanthone, 2,4-diethylthioxanthone, and 2,4-diisopropylthioxanthone; camphorquinone; halogenated ketone; acylphosphinoxide; acylphosphonate and the like. The compounding amount of the photopolymerization initiator is about 0.05 to 20 parts by weight for example based on 100 parts by weight of the base polymer such as an acryl polymer constituting the pressure sensitive adhesive.

Further, examples of the ultraviolet ray curable pressure sensitive adhesive include a rubber based pressure sensitive adhesive and acryl-based pressure sensitive adhesive containing an addition polymerizable compound having two or more unsaturated bonds, a photopolymerizable compound such as alkoxysilane having an epoxy group, and a photopolymerization initiator such as a carbonyl compound, an organic sulfur compound, a peroxide, an amine and an onium salt based compound, which are disclosed in JP-A No. 60-196956.

In the pressure-sensitive adhesive layer 2 of the dicing die-bonding film 10, a part of the pressure-sensitive adhesive layer 2 may be irradiated with ultraviolet rays so that the adhesive power of the portion 2a becomes smaller than the adhesive power of the other portion 2b. That is, the portion 2a can be formed where the adhesive power is reduced by using the substrate material 1 of which the entire or a part of the portion other than the portion corresponding to the semiconductor wafer attaching portion 3a on at least one side of the substrate material 1 is shielded, forming the ultraviolet-ray curing-type pressure-sensitive adhesive layer 2 onto the substrate material 1, and then curing the portion corresponding to the semiconductor wafer attaching portion 3a by ultraviolet irradiation. As the shielding material, a material that can serve as a photo mask on a support film can be manufactured by printing or vapor deposition.

When an impediment to curing due to oxygen occurs during the ultraviolet irradiation, it is desirable to shut off oxygen (air) from the surface of the ultraviolet-ray curing-type pressure-sensitive adhesive layer 2. Examples of the shut-off method include a method of coating the surface of the pressure-sensitive adhesive layer 2 with a separator and a method of conducting irradiation with ultraviolet rays in a nitrogen gas atmosphere.

The thickness of the pressure sensitive adhesive layer 2 is not particularly limited. However, it is preferably about 1 to 50 μm from the viewpoints of compatibility of chipping prevention of the chip cut face and holding the fixation of the adhesive layer, etc. It is preferably 2 to 30 μm, and further preferably 5 to 25 μm.

The die-bonding film 3 can have a configuration consisting of only a single layer of the adhesive layer, for example. Further, it may have a multi-layered structure of two layers or more by appropriately combining a thermoplastic resin having a different glass transition temperature and a thermosetting resin having a different heat curing temperature. Here, because cutting water is used in the dicing step of the semiconductor wafer, there is a case where the die-bonding film 3 absorbs moisture and moisture content becomes a normal condition or more. When the die-bonding film 3 is adhered to a substrate etc. with such high moisture content, water vapor is accumulated on an adhering interface in the step after curing, and there is a case where floating is generated. Therefore, by making the adhesive for die adhering have a configuration of sandwiching a core material having high moisture permeability with die adhesives, water vapor diffuses through the film in the step after curing, and such problem can be avoided. From such a viewpoint, the die-bonding film 3 may have a multi-layered structure in which the adhesive layer is formed on one face or both faces of the core material.

Examples of the core materials include such as a film (for example, a polyimide film, a polyester film, a polyethyleneterephthalate film, a polyethylenenaphthalate film, a polycarbonate film, etc.), a resin substrate reinforced with a glass fiber or a plastic nonwoven fiber, a silicon substrate, and a glass substrate.

The die-bonding film 3 according to the present invention is constituted by containing an epoxy resin as a main component. The epoxy resin is preferable from the viewpoint of containing fewer ionic impurities, etc. that corrode a semiconductor element. The epoxy resin is not particularly limited as long as it is generally used as an adhesive composition, and for example, a difunctional epoxy resin and a polyfunctional epoxy resin of such as a bisphenol A type, a bisphenol F type, a bisphenol S type, a brominated bisphenol A type, a hydrogenated bisphenol A type, a bisphenol AF type, a biphenyl type, a naphthalene type, a fluorine type, a phenol novolak type, an ortho-cresol novolak type, a trishydroxyphenylmethane type, and a tetraphenylolethane type epoxy resin or an epoxy resin of such as a hydantoin type, a trisglycidylisocyanurate type and a glycidylamine type epoxy resin are used. These can be used alone or two or more types can be used in combination. Among these epoxy resins, a novolak type epoxy resin, a biphenyl type epoxy resin, a trishydroxyphenylmethane type resin, and a tetraphenylolethane type epoxy resin are particularly preferable. This is because these epoxy resins have high reactivity with a phenol resin as a curing agent, and are superior in heat resistance, etc, Further, other thermosetting resins or thermoplastic resins can be used together in the die-bonding film 3 depending on necessity. Examples of the thermosetting resin include such as a phenol resin, an amino resin, an unsaturated polyester resin, a polyurethane resin, a silicone resin, and a thermosetting polyimide resin. These resins can be used alone or two or more types can be used in combination. Further, the curing agent of the epoxy resin is preferably a phenol resin.

Furthermore the phenol resin acts as a curing agent of the epoxy resin, and examples include a novolak type phenol resin such as a phenol novolak resin, a phenol aralkyl resin, a cresol novolak resin, a tert-butylphenol novolak resin, and a nonylphenol novolak resin; a resol type phenol resin; and polyoxystyrene such as polyparaoxystyrene. These can be used alone or two or more types can be used in combination. Among these phenol resins, a phenol novolak resin and a phenolaralkyl resin are particularly preferable. This is because connection reliability of the semiconductor device can be improved.

The compounding ratio of the epoxy resin and the phenol resin is preferably made, for example, such that the hydroxy group in the phenol resin becomes 0.5 to 2.0 equivalent per equivalent of epoxy group in the epoxy resin component. It is more preferably 0.8 to 1.2 equivalent. That is, when the both compounding ratio becomes outside of the range, a sufficient curing reaction does not proceed, and the characteristics of the epoxy resin cured product easily deteriorate.

Examples of the thermoplastic resin include a natural rubber, a butyl rubber, an isoprene rubber, a chloroprene rubber, an ethylene-vinylacetate copolymer, an ethylene-acrylic acid copolymer, an ethylene-acrylate copolymer, a polybutadiene resin, a polycarbonate resin, a thermoplastic polyimide resin, a polyamide resin such as 6-nylon and 6,6-nylon, a phenoxy resin, an acrylic resin, a saturated polyester resin such as PET and PBT, a polyamideimide resin, and a fluorine resin. These thermoplastic resins can be used alone or two type or more can be used in combination. Among these thermoplastic resins, the acrylic resin is particularly preferable in which the ionic impurities are less, the heat resistance is high, and reliability of the semiconductor element can be secured.

The acrylic resin is not particularly limited, and examples include such as polymers having one type or two types or more of acrylic acid or methacrylic ester having a straight chain or branched alkyl group having 30 or more carbon atoms, particularly 4 to 18 carbon atoms as a component. Examples of the alkyl group include a methyl group, an ethyl group, a propyl group, an isopropyl group, an n-butyl group, a t-butyl group, an isobutyl group, an amyl group, an isoamyl group, a hexyl group, a heptyl group, a cyclohexyl group, a 2-ethylhexyl group, an octyl group, an isooctyl group, a nonyl group, an isononyl group, a decyl group, an isodecyl group, an undecyl group, a lauryl group, a tridecyl group, a tetradecyl group, a stearyl group, an octadecyl group, and a dodecyl group.

Further, other monomers forming the polymers are not particularly limited, and examples include a carboxyl group-containing monomer such as acrylic acid, methacrylic acid, carboxylethylacrylate, carboxylpentylacrylate, itaconic acid, maleic acid, fumaric acid, and chrotonic acid; an acid anhydride monomer such as maleic anhydride and itaconic anhydride; a hydroxyl group-containing monomer such as 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate, and (4-hydroxymethylcyclohexyl)-methylacrylate; a sulfonic acid-containing monomer such as styrenesulfonic acid, allylsulfonic acid, 2-(meth)acrylamide-2-methylpropanesulfonic acid, (meth)acrylamidepropane sulfonic acid, sulfopropyl(meth)acrylate, and (meth)acryloyloxynaphthalene sulfonic acid; and a phosphoric acid-containing monomer such as 2-hydroxyethylacryloylphosphate.

Because the crosslinking is performed in the adhesive layer of the die-bonding film 3 to some extent in advance, a polyfunctional compound that reacts with a functional group at the end of molecular chain of the polymer is preferably added as a crosslinking agent when producing. Accordingly, the adhesive characteristic under high temperature is improved, and the improvement of the heat resistance is attempted.

Here, other additives can be appropriately compounded in the adhesive layer of the die-bonding film 3 depending on necessity. Examples of the other additives include a flame retardant, a silane coupling agent, and an ion trapping agent. Examples of the flame retardant include antimony trioxide, antimony pentoxide, a brominated epoxy resin. These can be used alone or two or more types can be used in combination. Examples of the silane coupling agent include β-(3,4-epoxycyclohexyl)ethyltrimethoxysilane, γ-glycidoxypropyltrimethoxysilane, and γ-glycidoxypropylmethyldiethoxysilane. These compounds can be used alone or two or more types can be used in combination. Examples of the ion trapping agents include hydrotalcites and bismuth hydroxide. These can be used alone or two or more types can be used in combination.

The thickness of the die-bonding film 3 is not particularly limited. However, it is about 5 to 100 μm, and preferably about 5 to 50 μm.

The dicing die-bonding films 10, 11 can be made to have an antistatic function. Accordingly, the circuit can be prevented from breaking down due to the generation of electrostatic energy during adhesion and peeling thereof and charging of a workpiece (a semiconductor wafer, etc.) by electrostatic energy or the like. Imparting the antistatic function can be performed with an appropriate manner such as a method of adding an antistatic agent or a conductive substance to the base material 1, the pressure sensitive adhesive layer 2, and the die-bonding film 3 and providing of a conductive layer composed of a charge-transfer complex, a metal film, etc. to the base material 1. These methods are preferably a method of which an impurity ion is difficult to generate, which impurity ion might change quality of the semiconductor wafer. Examples of the conductive substance (conductive filler) to be compounded for the purpose of imparting conductivity, improving thermal conductivity, etc. include a sphere-shaped, a needle-shaped, a flake-shaped metal powder such as silver, aluminum, gold, copper, nickel, and conductive alloy; a metal oxide such as alumina; amorphous carbon black, and graphite. However, the die-bonding films 3, 3' are preferably non-conductive from the viewpoint of having no electric leakage.

The die-bonding films 3, 3' of the dicing die-bonding films 10, 11 are preferably protected by a separator (not shown). The separator has a function as a protecting material that protects the die-bonding films 3, 3' until they are practically used. Further, the separator can be used as a supporting base material when transferring the die-bonding films 3, 3' to the pressure sensitive adhesive layer 2. The separator is peeled when pasting a workpiece onto the die-bonding films 3, 3' of the dicing die-bonding film. Polyethyleneterephthalate (PET), polyethylene, polypropylene, a plastic film, a paper, etc. whose surface is coated with a peeling agent such as a fluorine based peeling agent and a long chain alkylacrylate based peeling agent can be also used as the separator.

(Producing Method of Dicing Die-Bonding Film)

Next, the producing method of the dicing die-bonding film of the present invention is described with the dicing die-bonding film 10 as an example. First, the base material 1 can be formed with a conventionally known film producing method. Examples of the film-forming method include such as a calendar film-forming method, a casting method in an organic solvent, an inflation extrusion method in a closely sealed system, a T-die extrusion method, a co-extruding method, and a dry laminating method.

Next, a pressure-sensitive adhesive layer precursor is formed by coating a pressure-sensitive adhesive composition on the substrate material 1 to form a coating film and drying (by heat-crosslinking as necessary) the coating film under a prescribed condition. The coating method is not especially limited, and examples thereof include roll coating, screen coating, and gravure coating. The drying condition can be set variously depending on the thickness, the material, and the like of the coating film. Specifically, drying is conducted under the conditions of a drying temperature of 80 to 150° C. and a drying time of 0.5 to 5 minutes. The pressure-sensitive adhesive layer precursor may be formed by coating the pressure-sensitive adhesive composition on a separator to form a coating film and drying the coating film under the above condition. Then, the pressure-sensitive adhesive layer precursor is transferred onto the substrate material 1. The pressure-sensitive adhesive layer precursor thus formed is irradiated with ultraviolet rays to form a pressure-sensitive adhesive layer 2. As the condition of ultraviolet irradiation, the cumulative radiation is preferably within a range from 30 to 10,000 mJ/cm$^2$, and more preferably from 100 to 500 mJ/cm$^2$. When irradiation with ultraviolet rays is conducted at less than 30 mJ/cm$^2$, there is a case that curing of the pressure-sensitive adhesive layer becomes insufficient. As a result, the adhesion with the die-bonding film increases, and this causes a deterioration of the pickup property. Further, adhesive residue is generated in the die-bonding film after picking up. In contrast, when the irradiation of the ultraviolet rays exceeds 1,000 mJ/cm$^2$, there is a case that the substrate material is thermally damaged. Further, the tensile modulus becomes too high by excessive curing of the pressure-sensitive adhesive layer and deterioration of the expansion property. The adhesive power becomes too low, and thus there is a case that chip fly occurs upon dicing the semiconductor wafer.

Next, the material for forming a die-bonding film 3 is coated on a sheet of release paper in a predetermined thickness, followed by drying under a prescribed condition to form the die-bonding film 3. A dicing die-bonding film is formed by transferring the die-bonding film 3 on the pressure-sensitive adhesive layer 2. Thus, a dicing die-bonding film 10 according to the present invention can be obtained.

(Method of Manufacturing Semiconductor Devise)

Figure 3:
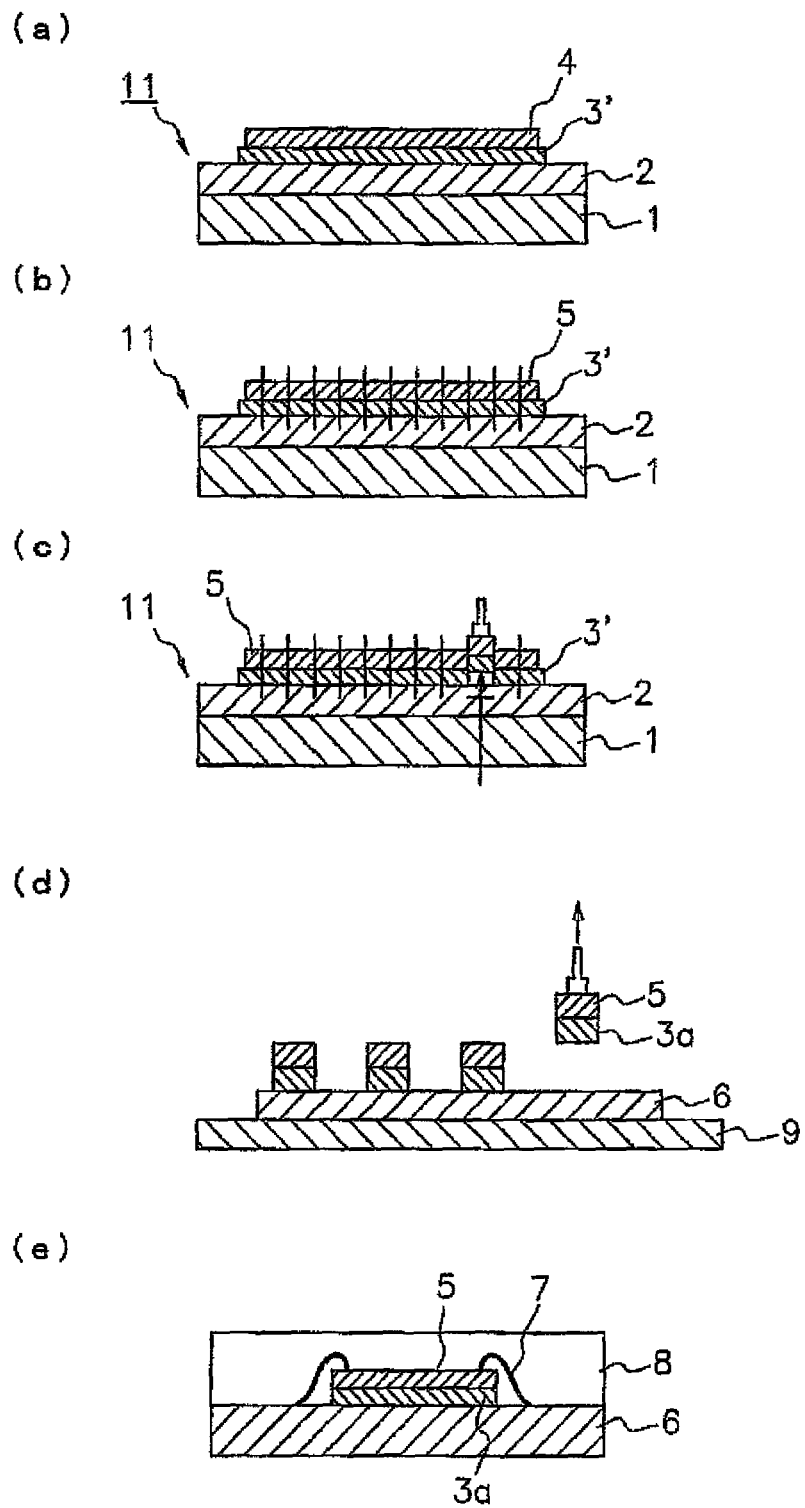
FIG. 3 is a schematic sectional view showing an example in which a semiconductor chip is mounted through a die-bonding film in the dicing die-bonding film.

The method of manufacturing a semiconductor device using the dicing die-bonding film 11 of the present invention will be described below with reference to FIG. 3.

First, a semiconductor wafer 4 is press-adhered on the die-bonding film 3' in the dicing die-bonding film 11, and it is fixed by adhering and holding (mounting step). The present step is performed while pressing with a pressing means such as a pressing roll.

Next, dicing of the semiconductor wafer 4 is conducted. With this operation, a semiconductor chip 5 is formed by cutting the semiconductor wafer 4 into a prescribed size to make it into individual pieces. The dicing is conducted following an ordinary method from the circuit face side of the semiconductor wafer 4. Further, a cutting method, so-called full cut, in which cutting-in is conducted to the die-bonding film 3, can be adopted in the present step. Since the die-bonding film 3 is formed from an epoxy resin, even if the film is cut by dicing, it is possible to prevent the adhesive residue of the adhesive from generating on the cut surface, thus making it possible to prevent cut surfaces from reattaching to each other (blocking) and to achieve more satisfactory pickup of the semiconductor chip. The dicing apparatus that is used in the present step is not especially limited, and a conventionally known apparatus can be used. Further, since the semiconductor wafer 4 is adhered and fixed by the dicing die-bonding film 3, chipping and chip fly can be suppressed, and at the same time, damage of the semiconductor wafer 4 can be suppressed. Even when cutting-in is conducted to the pressure-sensitive adhesive layer 2 by dicing, the generation of scraps can be prevented because the pressure-sensitive adhesive layer 2 is cured by the ultraviolet ray irradiation.

Next, expansion of the dicing die-bonding film 11 is conducted. The expansion is conducted using a conventionally known expanding apparatus. The expanding apparatus has a donut-shaped outer ring that can push the dicing die-bonding film 11 downwards through the dicing ring and an inner ring having a smaller diameter than the outer ring and supporting the dicing die-bonding film 11. Since only the portion 2a in the pressure-sensitive adhesive layer 2 is cured by ultraviolet irradiation and the other portion 2b is not cured in the dicing die-bonding film 11, the space between the adjacent semiconductor chips can be sufficiently broadened without breaking. As a result, damage to the semiconductor chip by the semiconductor chips contacting to each other upon picking up, which is described later, can be prevented.

Picking up of the semiconductor chip 5 is performed to peel off the semiconductor chip 5 that is adhered and fixed to the dicing die-bonding film 10. Picking up is performed without irradiating the pressure-adhesive layer 2 with ultraviolet rays. The method of picking up is not especially limited, and various conventionally known methods can be adopted. Examples thereof include a method of pushing up the individual semiconductor chip 5 from the dicing die-bonding film 10 side using a needle and picking up the semiconductor chip 5 that is pushed up with a picking up apparatus. Since the peeling property of the pressure-sensitive adhesive layer 2 and the die-bonding film 3 is satisfactory in the dicing die-bonding film 10 of the present invention, the pickup can be performed by reducing the number of needles and by increasing the yield ratio even when the pushing up amount is small.

The semiconductor chip 5 picked up is adhered and fixed to an adherend 6 through the die-bonding film 3a interposed therebetween (die bonding). The adherend 6 is mounted onto a heat block 9. Examples of the adherend 6 include such as a lead frame, a TAB film, a substrate, and a semiconductor chip separately produced. The adherend 6 may be a deformable adherend that are easily deformed, or may be a non-deformable adherend (a semiconductor wafer, etc.) that is difficult to deform, for example.

A conventionally known substrate can be used as the substrate. Further, a metal lead frame such as a Cu lead frame and a 42 Alloy lead frame and an organic substrate composed of glass epoxy, BT (bismaleimide-triazine), and polyimide can be used as the lead frame. However, the present invention is not limited to this, and includes a circuit substrate that can be used by mounting a semiconductor element and electrically connecting with the semiconductor element.

When the die-bonding film 3 is a thermosetting type die-bonding film, the semiconductor chip 5 is adhered and fixed onto the adherend 6 by heat-curing to improve the heat resistance strength. Here, a product in which the semiconductor chip 5 is adhered and fixed onto a substrate etc. through the die-bonding film 3a interposed therebetween can be subjected to a reflow step. After that, wire bonding is performed by electrically connecting the tip of a terminal part (inner lead) of the substrate and an electrode pad (not shown) on the semiconductor chip 5 with a bonding wire 7, and furthermore, the semiconductor chip is sealed with a sealing resin 8, and the sealing resin 8 is after cured. Accordingly, the semiconductor device according to the present embodiment is manufactured.

EXAMPLES

The preferred examples of this invention are illustratively described in detail hereinbelow. However, the materials, the compounding amount, etc. described in these examples are not intended to limit the scope of this invention to these only unless otherwise stated, and they are only explanatory examples. Further, part in each example is a weight standard unless otherwise stated.

Example 1

Manufacture of Dicing Film

An acryl polymer A having a weight average molecular weight of 850,000 was obtained by charging 88.8 parts of 2-ethylhexylacrylate (hereinbelow, refers to as "2EHA"), 11.2 parts of 2-hydroxyethylacrylate (hereinbelow, referred to as "HEA"), 0.2 parts of benzoylperoxide, and 65 parts of toluene into a reactor equipped with a condenser, a nitrogen introducing pipe, a thermometer, and a stirring apparatus, and performing a polymerization process at 61° C. for 6 hours in a nitrogen flow. The weight average molecular weight is as described below. The molar ratio of 2EHA and HEA was made to be 100 mol to 20 mol.

An acryl polymer A' was obtained by adding 12 parts of 2-methacryloyloxyethylisocyanate (hereinbelow, referred to as "MOI") (80 mol % to HEA) to the acryl polymer A and performing an addition reaction process at 50° C. for 48 hours in an air flow.

Next, a pressure sensitive adhesive solution was manufactured by adding 8 parts of a polyisocyanate compound (trade name: COLONATE L, manufactured by Nippon Polyurethane Industry Co., Ltd.) and 5 parts of a photopolymerization initiator (trade name: IRUGACURE 651, manufactured by Ciba Specialty Chemicals) based on 100 parts of the acryl polymer A'.

A pressure-sensitive adhesive layer precursor having a thickness of 10 μm was formed by coating the prepared pressure-sensitive adhesive solution on a surface of a PET peeling liner subjected to a silicone treatment, followed by heat crosslinking at 120° C. for 2 minutes. Then, a polyolefin film having a thickness of 100 μm was bonded on a surface of the pressure-sensitive adhesive layer precursor, followed by storage at 50° C. for 24 hours. Then, only the portion (220 mm in diameter) corresponding to the portion (200 mm in diameter) of the semiconductor wafer attaching portion of the pressure-sensitive adhesive layer precursor was irradiated with ultraviolet rays to form a pressure-sensitive adhesive layer. The irradiation condition of ultraviolet rays is as follow.

<Irradiation Condition of Ultraviolet Rays>
Ultraviolet (UV) irradiation apparatus: High pressure mercury lamp
Ultraviolet cumulative radiation: 500 mJ/cm$^2$
Output: 75 W
Irradiation strength: 150 mJ/cm$^2$
The pressure-sensitive adhesive layer precursor was irradiated directly with ultraviolet rays.

<Manufacture of Die-Bonding Film>

59 parts of an epoxy resin 1 (trade name: EPICOAT 1004, manufactured by Japan Epoxy Resins Co., Ltd.), 53 parts of an epoxy resin 2 (trade name: EPICOAT 827, manufactured by Japan Epoxy Resins Co., Ltd.), 121 parts of a phenol resin (trade name: MILEX XLC-4L, manufactured by Mitsui Chemicals, Inc.), 222 parts of sphere silica (trade name: SO-25R, manufactured by Admatechs Co., Ltd.) based on 100 parts of an acrylate polymer (trade name: PARACRON W-197CM, manufactured by Negami Chemical Industrial Co., Ltd.) having ethylacrylate-methylmethacrylate as the main component were dissolved into methylethylketone, and prepared so that the concentration became 23.6% by weight.

A solution of this adhesive composition was applied onto a mold release treated film composed of a polyethylene terephthalate film having a thickness of 38 μm in which a silicone mold release treatment was performed as the peeling liner (separator), and then dried at 130° C. for 2 minutes. Accordingly, a die-bonding film having a thickness of 25 μm was manufactured. Furthermore, the dicing die-bonding film according to the present example was obtained by transferring the die-bonding film to the pressure sensitive adhesive layer side in the dicing film described above.

<Measurement of Weight Average Molecular Weight Mw>

The measurement of the weight average molecular weight Mw was performed by GPC (gel permeation chromatography). The measurement condition is as follows. Here, the weight average molecular weight was calculated in terms of polystyrene.

Measurement apparatus: HLC-8120GPC (product name, manufactured by Tosoh Corporation)
Column: TSKgel GMH-H (S)×2 (product number, manufactured by Tosoh Corporation)
Flow rate: 0.5 ml/min
Injection rate: 100 μl
Column temperature: 40° C.
Eluent: THF
Injection sample concentration: 0.1% by weight
Detector: a differential refractometer Examples 2 to 14

In Examples 2 to 14, each dicing die-bonding film was manufactured in the same manner as in Example 1, except that the composition and the content were changed to those shown in Table 1.

TABLE 1

| | Acrylic acid ester | | | | | Hydroxyl group-containing monomer | | Isocyanate compound | | Toluene | C/L | T/C | Photopolymerization initiator |
|---|---|---|---|---|---|---|---|---|---|---|---|---|---|
| | 2EHA | i-OA | i-NA | BA | AA | HEA | 4HBA | MOI | AOI | | | | |
| Example 1 | 88.0 (100) | — | — | — | — | 11.2 (20) | — | 12 (80) | — | 65 | 8 | — | 5 |
| Example 2 | 93 (100) | — | — | — | — | 7 (12) | — | 7.8 (83) | — | 65 | 8 | — | 5 |
| Example 3 | 84.1 (100) | — | — | — | — | 15.9 (30) | — | 17 (80) | — | 65 | 8 | — | 5 |
| Example 4 | — | 88.8 (100) | — | — | — | 11.2 (20) | — | 12 (80) | — | 65 | 8 | — | 5 |
| Example 5 | — | — | 89.5 (100) | — | — | 10.5 (20) | — | 11.2 (80) | — | 65 | 8 | — | 5 |
| Example 6 | 61.8 (62.5) | — | — | 25.8 (37.5) | — | 12.5 (20) | — | 13.3 (80) | — | 65 | 8 | — | 5 |
| Example 7 | 89.5 (100) | — | — | — | — | — | 10.5 (15) | 9.1 (80) | — | 65 | 8 | — | 5 |
| Example 8 | 88.8 (100) | — | — | — | — | 11.2 (20) | — | — | 10.9 (80) | 65 | 8 | — | 5 |
| Example 9 | 88.8 (100) | — | — | — | — | 11.2 (20) | — | 10.5 (70) | — | 65 | 8 | — | 5 |
| Example 10 | 88.8 (100) | — | — | — | — | 11.2 (20) | — | 13.5 (90) | — | 65 | 8 | — | 5 |
| Example 11 | 91.1 (100) | — | — | — | 0.3 (0.8) | 8.6 (15) | — | 10.4 (90) | — | 65 | — | 0.5 | 5 |
| Example 12 | 88.8 (100) | — | — | — | — | 11.2 (20) | — | 12 (80) | — | 100 | 8 | — | 5 |
| Example 13 | 88.8 (100) | — | — | — | — | 11.2 (20) | — | 12 (80) | — | 40 | 8 | — | 5 |
| Example 14 | 80.7 (100) | — | — | — | — | 19.3 (38) | — | 21.8 (84) | — | 65 | 8 | — | 5 |

The numerical values in parentheses represent "mol", while the numerical values in parentheses in MOI and AOI represent "molar ratio" to HEA or 4HBA.

The meanings of abbreviations described in Table 1 and Table 2 mentioned hereinafter are as follows.
2EHA: 2-ethylhexyl acrylate
i-OA: Isooctyl acrylate
i-NA: Isononyl acrylate
BA: n-butyl acrylate
AA: Acrylic acid
HEA: 2-hydroxyethyl acrylate
4HBA: 4-hydroxybutyl acrylate
AOI: 2-acryloyloxyethyl isocyanate
C/L: Polyisocyanate compound (manufactured by Nippon Polyurethane Industry Co., Ltd. under the trade name of "CORONATE L",)
T/C: Epoxy-based crosslinking agent (manufactured by Mitsubishi Gas Chemical Company, Inc. under the trade name of "TETRAD C")

Comparative Examples 1 to 8

In Comparative Examples 1 to 7, each dicing die-bonding film was manufactured in the same manner as in Example 1 except that the composition and the content were changed to those shown in Table 2. In Comparative Example 8, the dicing die-bonding film was manufactured in the same manner as in Example 1, except that the composition and the content were changed to those shown in Table 2 and the ultraviolet irradiation before attaching of the die-bonding film was not conducted.

TABLE 2

| | Acrylic acid ester | | | | | Hydroxyl group-containing monomer | | Isocyanate compound | | Toluene | C/L | T/C | Photopolymerization initiator |
|---|---|---|---|---|---|---|---|---|---|---|---|---|---|
| | 2EHA | i-OA | i-NA | BA | AA | HEA | 4HBA | MOI | AOI | | | | |
| Comparative Example 1 | — | — | — | 84.7 (100) | — | 15.3 (20) | — | 16.4 (80) | — | 65 | 8 | — | 5 |
| Comparative Example 2 | 98.8 (100) | — | — | — | — | 1.2 (2) | — | 1.3 (80) | — | 65 | 8 | — | 5 |
| Comparative Example 3 | 76 (100) | — | — | — | — | 24 (50) | — | 25.6 (80) | — | 65 | 8 | — | 5 |
| Comparative Example 4 | 88.8 (100) | — | — | — | — | 11.2 (20) | — | 7.5 (50) | — | 65 | 8 | — | 5 |
| Comparative Example 5 | 88.8 (100) | — | — | — | — | 11.2 (20) | — | 12 (80) | — | 230 | 8 | — | 5 |
| Comparative Example 6 | 88.8 (100) | — | — | — | — | 11.2 (20) | — | 12 (80) | — | 65 | 1 | — | 5 |

TABLE 2-continued

|  | Acrylic acid ester | | | | | Hydroxyl group-containing monomer | | Isocyanate compound | | Toluene | C/L | T/C | Photo-polymerization initiator |
| --- | --- | --- | --- | --- | --- | --- | --- | --- | --- | --- | --- | --- | --- |
|  | 2EHA | i-OA | i-NA | BA | AA | HEA | 4HBA | MOI | AOI |  |  |  |  |
| Comparative Example 7 | 88.8 (100) | — | — | — | — | 11.2 (20) | — | 15 (100) | — | 65 | 8 | — | 5 |
| Comparative Example 8 | 84.1 (100) | — | — | — | — | 15.9 (30) | — | 17 (80) | — | 65 | 8 | — | 5 |

The numerical values in parentheses represent "mol", while the numerical values in parentheses in MOI and AOI represent "molar ratio" to HEA or 4HBA.

(Dicing)

Using each of dicing die-bonding films of the Examples and Comparative Examples, dicing of a semiconductor wafer was actually performed in a manner described below, and performance of each dicing die-bonding film was evaluated.

The backside of a semiconductor wafer (diameter 8 inches, thickness 0.6 mm) was polished, and a mirror wafer having a thickness of 0.15 mm was used as a workpiece. After peeling the separator from the dicing die-bonding film, a mirror wafer was pasted onto the die-bonding film by roll pressing at 40° C., and dicing was furthermore performed. Further, the dicing was performed in full cut so that the chip size became 1 mm square. Whether there is chip fly or not was confirmed for the semiconductor wafer and the dicing die-bonding film after cutting. For chip fly, the case where even one semiconductor chip flies was made to be X, and the case where they did not fly was made to be ○. The wafer grinding condition, the pasting condition, and the dicing condition are described later.

<Wafer Grinding Condition>
Grinding apparatus: DFG-8560 manufactured by DISCO Corporation
Semiconductor wafer: 8 inch diameter (backside was ground so as to be a thickness of 0.6 mm to 0.15 mm)
<Pasting Condition>
Pasting apparatus: MA-3000II manufactured by Nitto Seiki Co., Ltd.
Pasting speed: 10 mm/min
Pasting pressure: 0.15 MPa
Stage temperature when pasting: 40° C.
<Dicing Condition>
Dicing apparatus: DFD-6361 manufactured by DISCO Corporation
Dicing ring: 2-8-1 (manufactured by DISCO Corporation)
Dicing speed: 80 mm/sec
Dicing blade:
Z1; 2050HEDD manufactured by DISCO Corporation
Z2; 2050HEBB manufactured by DISCO Corporation
Dicing blade rotation speed:
Z1; 40,000 rpm
Z2; 40,000 rpm
Blade height:
Z1; 0.215 mm (depending on the thickness of the semiconductor wafer (0.170 mm when the thickness of the wafer is 75 μm))
Z2; 0.085 mm
Cutting method: A mode/step cut
Wafer chip size: 1.0 mm square
(Pickup)

Using each of the dicing die-bonding films of the Examples and Comparative Examples, pickup was performed after dicing of the semiconductor wafer was actually performed in a manner described below, and performance of each dicing die-bonding film was evaluated.

A backside polishing treatment was conducted on a semiconductor wafer (8 inch in diameter and 0.6 mm in thickness), and a mirror wafer having a thickness of 0.075 mm was used as a workpiece. The separator was peeled off from the dicing die-bonding film, the mirror wafer was bonded on the die-bonding film by roll pressure-bonding at 40° C., and dicing was conducted. The dicing was conducted to full-cut so that the chips had a size of 10 mm².

Next, the expansion step was conducted by stretching each dicing die-bonding film to make the space between chips a predetermined interval. However, the expansion step was conducted on the dicing die-bonding film of Comparative Example 8 after ultraviolet irradiation. As the irradiation condition of ultraviolet rays, an apparatus manufactured by Nitto Seiki Co., Ltd. under the trade name of UM-810 was used as an ultraviolet (UV) irradiation apparatus and cumulative radiation of ultraviolet rays was adjusted to 300 mJ/cm². The ultraviolet irradiation was conducted from the polyolefin film side.

Evaluation of pickup properties was conducted by picking up the semiconductor chip with a method of pushing-up the semiconductor chip by a needle from the substrate material side of each dicing die-bonding film. Specifically, 400 semiconductor chips were continuously picked up, and the Success rate was shown when the picking up was conducted in the following conditions A and B.

Excellent: Success rates are 100% in the both cases where evaluation is conducted under the condition A and under the condition B.
Good: Success rate is 100% when evaluation is conducted under the condition A, while success rate is not 100% when evaluation is conducted under the condition B.
Poor: Success rates are not 100% in the both cases where evaluation is conducted under the condition A and under the condition B.

<Wafer Grinding Condition>
Grinding apparatus: DFG-8560 manufactured by DISCO Corporation
Semiconductor wafer: 8 inch diameter (backside was ground so as to be a thickness of 0.6 mm to 0.075 mm)
<Pasting Condition>
Pasting apparatus: MA-3000II manufactured by Nitto Seiki Co., Ltd.
Pasting speed: 10 mm/min
Pasting pressure: 0.15 MPa
Stage temperature when pasting: 40° C.
<Dicing Condition>
Dicing apparatus: DFD-6361 manufactured by DISCO Corporation
Dicing ring: 2-8-1 (manufactured by DISCO Corporation)
Dicing speed: 80 mm/sec
Dicing blade:
Z1; 2050HEDD manufactured by DISCO Corporation
Z2; 2050HEBB manufactured by DISCO Corporation Dicing blade rotation speed:
Z1; 40,000 rpm
Z2; 40,000 rpm
Blade height:
Z1; 0.170 mm (depending on the thickness of the semiconductor wafer (0.170 mm when the thickness of the wafer is 75 μm))
Z2; 0.085 mm
Cutting method: A mode/step cut
Wafer chip size: 10.0 mm square
<Pickup Condition>
Each pickup was performed in a condition A and a condition B shown in the following Table 3.

TABLE 3

|  | Condition A | Condition B |
|---|---|---|
| Needle | Overall length: 10 mm, Diameter: 0.7 mm, Acute angle: 15 deg, Tip radius R: 350 μm | Same as the left |
| Number of needles | 5 | 5 |
| Needle push-up amount (μm) | 350 | 200 |
| Needle push-up rate (mm/sec) | 5 | 5 |
| Collet holding time (msec) | 200 | 200 |
| Expand (mm/sec) | 3 | 3 |

(Measurement of Tensile Elastic Modulus)

A tensile test was performed in an MD direction or a TD direction on a sample having a size of initial length 10 mm and a cross sectional area of 0.1 to 0.5 mm$^2$ with a measurement condition having a measurement temperature of 23° C., a distance between chucks of 50 mm, and a tensile speed of 50 mm/min, and the changed amount (mm) of stretching of the sample in each direction was measured. As a result, the tensile elastic modulus was obtained by drawing a tangent in a part of the initial rise-up of the obtained S-S curve, dividing the tensile strength when the tangent corresponds to 100% stretch by the cross-section of the base material film. Here, the measurement of the tensile elastic modulus after ultraviolet ray irradiation was performed after radiating ultraviolet rays from the polyolefin film side with the irradiation condition.

(Adhesive Residue of Dicing Ring)

The dicing film was peeled from the dicing ring, and whether the adhesive residue was generated or not in the dicing ring was confirmed visually. The dicing ring in which the adhesive residue was confirmed was made to be X, and in which it was not confirmed was made to be ○.

Peeling Adhesive Power

A sample piece having a width of 10 mm was cut out from each dicing die-bonding film and attached on a silicon mirror wafer placed on a hot plate at 40° C. After the sample piece was left to stand for about 30 minutes, the sample was irradiated with ultraviolet rays from the dicing film side, and the peeling adhesive power was measured using a tensile test machine. The measurement conditions are as follows: a peeling angle of 15° and a tensile rate of 300 mm/min. Storage and measurement of the peeling adhesive power of the sample piece were conducted under the environment of a temperature of 23° C. and a relative humidity of 50%.

TABLE 4

|  | Mw (10,000) | UV irradiation | Tensile modulus after UV curing (MPa) | Pickup properties | Chip fly | Adhesive residue on dicing ring | Peeling adhesive power (N/10 mm) |
|---|---|---|---|---|---|---|---|
| Example 1 | 58 | Irradiation before attaching die-bonding film | 19.7 | ⊙ | ○ | ○ | 0.9 |
| Example 2 | 56 | Irradiation before attaching die-bonding film | 11.3 | ⊙ | ○ | ○ | 1.1 |
| Example 3 | 62 | Irradiation before attaching die-bonding film | 85.1 | ⊙ | ○ | ○ | 0.8 |
| Example 4 | 58 | Irradiation before attaching die-bonding film | 19.3 | ⊙ | ○ | ○ | 0.9 |
| Example 5 | 56 | Irradiation before attaching die-bonding film | 19.1 | ⊙ | ○ | ○ | 0.9 |
| Example 6 | 71 | Irradiation before attaching die-bonding film | 50.4 | ○ | ○ | ○ | 1.3 |
| Example 7 | 63 | Irradiation before attaching die-bonding film | 17.6 | ⊙ | ○ | ○ | 0.9 |
| Example 8 | 58 | Irradiation before attaching die-bonding film | 20.1 | ⊙ | ○ | ○ | 0.9 |
| Example 9 | 58 | Irradiation before attaching die-bonding film | 16.2 | ⊙ | ○ | ○ | 1.2 |
| Example 10 | 59 | Irradiation before attaching die-bonding film | 21.3 | ⊙ | ○ | ○ | 0.8 |
| Example 11 | 62 | Irradiation before attaching die-bonding film | 26.7 | ○ | ○ | ○ | 1.3 |

TABLE 4-continued

|  | Mw (10,000) | UV irradiation | Tensile modulus after UV curing (MPa) | Pickup properties | Chip fly | Adhesive residue on dicing ring | Peeling adhesive power (N/10 mm) |
|---|---|---|---|---|---|---|---|
| Example 12 | 41 | Irradiation before attaching die-bonding film | 19.5 | ⊙ | ○ | ○ | 0.9 |
| Example 13 | 83 | Irradiation before attaching die-bonding film | 19.9 | ⊙ | ○ | ○ | 1.2 |
| Example 14 | 64 | Irradiation before attaching die-bonding film | 120 | ⊙ | ○ | ○ | 1.1 |

TABLE 5

|  | Mw (10,000) | UV irradiation | Tensile modulus after UV curing (MPa) | Pickup properties | Chip fly | Adhesive residue on dicing ring | Peeling adhesive power (N/10 mm) |
|---|---|---|---|---|---|---|---|
| Comparative Example 1 | 88 | Irradiation before attaching die-bonding film | 82.6 | X | ○ | ○ | 2.4 |
| Comparative Example 2 | 54 | Irradiation before attaching die-bonding film | 7.2 | X | ○ | X | 2.0 |
| Comparative Example 3 | 67 | Irradiation before attaching die-bonding film | 120 | X | ○ | ○ | 1.7 |
| Comparative Example 4 | 58 | Irradiation before attaching die-bonding film | 11.1 | X | ○ | ○ | 1.8 |
| Comparative Example 5 | 21 | Irradiation before attaching die-bonding film | 16.2 | ○ | ○ | X | 0.9 |
| Comparative Example 6 | 58 | Irradiation before attaching die-bonding film | 6.1 | X | X | X | 1.8 |
| Comparative Example 7 | 59 | Irradiation before attaching die-bonding film | 22.1 | X | ○ | X | 1.7 |
| Comparative Example 8 | 62 | Irradiation after dicing | 85.1 | X | X | ○ | 1.6 |

The invention claimed is:

1. A method of manufacturing a semiconductor device using a dicing die-bonding film comprising a dicing film having a pressure-sensitive adhesive layer on a substrate material, and a die-bonding film formed on the pressure-sensitive adhesive layer, the method comprising:
preparing the dicing die-bonding film in which the pressure-sensitive adhesive layer contains a polymer including an acrylic acid ester as a main monomer, 10 to 40 mol % of a hydroxyl group-containing monomer based on the acrylic acid ester, and 70 to 90 mol % of an isocyanate compound having a radical reactive carbon-carbon double bond based on the hydroxyl group-containing monomer, and is also cured by irradiation with ultraviolet rays under predetermined conditions, and wherein the die-bonding film contains an epoxy resin, and is also bonded on the pressure-sensitive adhesive layer after irradiation with ultraviolet rays;
pressure-bonding a semiconductor wafer on the die-bonding film;
dicing the semiconductor wafer together with the die-bonding film to form a semiconductor chip; and
peeling the semiconductor chip from the pressure-sensitive adhesive layer together with the die-bonding film; wherein
the step of pressure-bonding of the semiconductor wafer to the step of peeling the semiconductor chip are conducted without irradiating the pressure-sensitive adhesive layer with ultraviolet rays.

2. The method of manufacturing a semiconductor device according to claim 1, wherein the acrylic acid ester is at least one selected from the group consisting of 2-ethylhexylacrylate and isooctylacrylate.

3. The method of manufacturing a semiconductor device according to claim 1, wherein the polymer comprises a total amount of carboxyl group-containing monomer of 0 to 3% by weight relative to the entire monomer component of the polymer.

4. The method of manufacturing a semiconductor device according to claim 1, wherein the polymer does not contain a polyfunctional monomer as a monomer component.

5. The method of manufacturing a semiconductor device according to claim 1, wherein the irradiation with ultraviolet rays is conducted at 30 to 1,000 mJ/cm$^2$.

6. The method of manufacturing a semiconductor device according to claim 1, wherein the die-bonding film comprises a semiconductor wafer attaching portion, and wherein the pressure-sensitive adhesive layer comprises a portion corresponding to the semiconductor wafer attaching portion of the die-bonding film, and wherein the portion of the pressure-sensitive adhesive layer corresponding to the semiconductor wafer attaching portion of the die-bonding film in is at least subjected to the irradiation with ultraviolet rays.

7. The method of manufacturing a semiconductor device according to claim 1, wherein the acrylic acid ester is $CH_2$=CHCOOR, wherein R is an alkyl group having 6 to 10 carbon atoms.

8. The method of manufacturing a semiconductor device according to claim 1, wherein the hydroxyl group-containing monomer is at least any one selected from the group consisting of 2-hydroxyethyl(meth)acrylate, 2-hydroxypropyl(meth)acrylate, 4-hydroxybutyl(meth)acrylate, 6-hydroxyhexyl(meth)acrylate, 8-hydroxyoctyl(meth)acrylate, 10-hydroxydecyl(meth)acrylate, 12-hydroxylauryl(meth)acrylate and (4-hydroxymethylcyclohexyl)methyl(meth)acrylate.

9. The method of manufacturing a semiconductor device according to claim 1, wherein the isocyanate compound having a radical reactive carbon-carbon double bond is at least either of 2-methacryloyloxyethyl isocyanate or 2-acryloyloxyethyl isocyanate.

10. The method of manufacturing a semiconductor device according to claim 1, wherein a weight average molecular weight of the polymer is within a range from 350,000 to 1,000,000.

11. The method of manufacturing a semiconductor device according to claim 1, wherein a tensile modulus at 23° C. of the pressure-sensitive adhesive layer after ultraviolet irradiation is within a range from 7 to 170 MPa.

12. The method of manufacturing a semiconductor device according to claim 1, wherein the pressure-sensitive adhesive layer does not contain acrylic acid.

* * * * *

UNITED STATES PATENT AND TRADEMARK OFFICE
CERTIFICATE OF CORRECTION

PATENT NO. : 8,617,928 B2  
APPLICATION NO. : 12/863063  
DATED : December 31, 2013  
INVENTOR(S) : Kamiya et al.

It is certified that error appears in the above-identified patent and that said Letters Patent is hereby corrected as shown below:

In the Specification

In column 11 at line 25, Change "(meth)acrylicamidepropanesulfonic" to --(meth)acrylamidepropanesulfonic--.

In column 13 at line 48, Change "2-methyl-2-hydroxypropyophenone," to --2-methyl-2-hydroxypropiophenone,--.

In column 15 at line 25, Change "etc," to --etc.--.

Signed and Sealed this  
Second Day of September, 2014

Michelle K. Lee  
*Deputy Director of the United States Patent and Trademark Office*